(12) United States Patent
Bergmans et al.

(10) Patent No.: US 6,678,862 B1
(45) Date of Patent: Jan. 13, 2004

(54) DETECTION APPARATUS

(75) Inventors: Johannes Wilhelmus Maria Bergmans, Eindhoven (NL); Willem Marie Julia Marcel Coene, Eindhoven (NL); Rob Otte, Eindhoven (NL); Simon Derek Bramwell, Romsey (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 346 days.

(21) Appl. No.: 09/806,585
(22) PCT Filed: Jul. 20, 2000
(86) PCT No.: PCT/EP00/06975
§ 371 (c)(1), (2), (4) Date: Mar. 20, 2001
(87) PCT Pub. No.: WO01/10044
PCT Pub. Date: Feb. 8, 2001

(30) Foreign Application Priority Data

Aug. 2, 1999 (EP) .............................................. 99306124

(51) Int. Cl.⁷ ........................... H03M 13/03; H04L 27/06
(52) U.S. Cl. ........................................ 714/794; 375/341
(58) Field of Search ................................ 714/794, 795, 714/792, 796; 369/59.22, 47, 47.35; 375/341, 262, 263, 265

(56) References Cited

U.S. PATENT DOCUMENTS

| | | | | |
|---|---|---|---|---|
| 5,734,680 A | * | 3/1998 | Moore et al. | 375/263 |
| 5,781,590 A | * | 7/1998 | Shiokawa et al. | 375/341 |
| 5,991,914 A | * | 11/1999 | Honma | 714/794 |
| 6,480,984 B1 | * | 11/2002 | Aziz | 714/795 |

OTHER PUBLICATIONS

Faucheux et al., Emerging Techniques for Communication Terminals, "Choice of an Equalizer for a High Rate Data Transmission System in an Indoor Radio Channel", Toulouse, France, Jul. 9, 1997).*

(List continued on next page.)

*Primary Examiner*—Christine T. Tu
(74) *Attorney, Agent, or Firm*—Michael E. Belk

(57) ABSTRACT

A partial response maximum likelihood (PRML) bit detection apparatus is disclosed for deriving a bit sequence ($x_k$) from an input information signal. The apparatus comprises input means for receiving the input information signal. The apparatus further comprises sampling means for sampling the input information signal at sampling instants so as to obtain samples ($z_k$) of the information signal at said sampling instants. The apparatus also comprises calculating means (50, 70) for (a) calculating (50) at a sampling instant $t_i$ for one or more of a plurality of states $s_j$ (Sa, Sb, Sc) at said sampling instant, an optimum path metric value $PM(s_j,t_i)$ and for determining for said one or more states a best predecessor state at the directly preceding sampling instant $t_{i-1}$, a state at said sampling instant identifying a sequence of n subsequent bits. The apparatus further comprises calculating means for (b) establishing (70) the best path from the state at the said sampling instant $t_i$ having the lowest optimum path metric value, back in time towards the sampling instant $t_{i-N}$ via best predecessor states, established earlier for earlier sampling instants, to establish an optimum state at said sampling instant $t_{i-N}$. The apparatus further comprises the calculating means for (c) outputting at least one bit ($x_{k-MB-1}$) of said n bits of the sequence of bits corresponding to said established optimum state at said sampling instant $t_{i-N}$. The steps (a) to (c) are repeated for a subsequent sampling instant $t_{i+1}$. The apparatus is characterized in that mutually complementary sequences of n subsequent bits are allocated to the same state.

8 Claims, 15 Drawing Sheets

OTHER PUBLICATIONS

Figure 1:
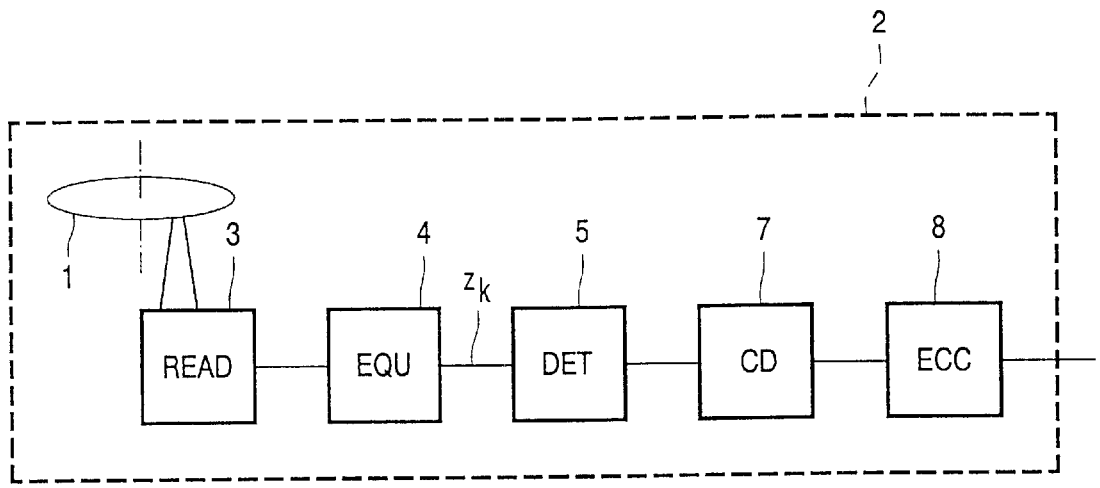

Spinnler et al., "Design of Hyper States for Reduced–State Sequence Estimation", Proceedings of the International conference on communications (ICC), US New York, IEEE Jun. 16, 1995 pp. 1–6.*

Matui, "Adaptive Reduced–State Sequence Estimation in Magnetic Digital Recording Channels", NEC Research and Development, JP, Nippon Electric LTD, Tokyo, vol. 35, No. 2, Apr. 1, 1994, pp. 188–194.*

Eyuboglu et al., "Reduced–State Sequence Estimation for Coded Modulation on Intersymbol Interferenece Channels", IDDD Journal on Selected Areas in Communications, US, IEEE Inc., New York, vol. 7, No. 6, Aug. 1, 1989, pp. 989–995.*

* cited by examiner

DETECTION APPARATUS

The invention pertains to a partial response maximum likelihood (PRML) bit detection apparatus for deriving a bit sequence from an input information signal, comprising
  input means for receiving the input information signal,
  sampling means for sampling, at a predetermined sampling frequency, the input information signal at sampling instants $t_i$ so as to obtain sample values of the input information signal at said sampling instants $t_i$, said sampling frequency having a relationship with a bit frequency,
  calculating means for
  (a) calculating at a sampling instant $t_i$ for one or more of a plurality of states $s_j$ at said sampling instant, an optimum path metric value $PM(s_j,t_i)$ and for determining for each of said one or more states a best predecessor state at the directly preceding sampling instant $t_{n-1}$, a state at said sampling instant identifying a sequence of n subsequent bits,
  (b) establishing the best path from the state at the said sampling instant $t_i$ having the lowest optimum path metric value, back in time towards the sampling instant $t_{i-N}$ via best predecessor states, established earlier for earlier sampling instants, to establish an optimum state at said sampling instant $t_{i-N}$,
  (c) outputting at least one bit of said n bits of the sequence of bits corresponding to said established optimum state at said sampling instant $t_{i-N}$,
  (d) repeating said steps (a) to (c) for a subsequent sampling instant $t_{i+1}$.

A bit detection apparatus according to the introductory paragraph is widely used in magnetic, magneto-optical and optical recording systems. These systems usually employ modulation codes with a d constraint. This constraint stipulates that runs of ones and zeros in the RLL channel bitstream be at least d+1 symbol intervals long. The value d=2 is used, for example, in compact disc (CD) and digital versatile disc (DVD) systems, while d=1 is encountered in magneto-optical recording and the new rewritable DVR-format. Among other advantages, the d constraint limits intersymbol interference (ISI), thereby facilitating equalization and bit detection. As a result, early reception schemes for CD could generally get by with a fixed prefilter for noise suppression and equalization, and a memoryless slicer for bit detection [1]. More recent optical recording systems, like CD-R, CD-RW, D-VCD, DVD, and especially DVR and other formats succeeding DVD, exhibit smaller mechano/optical tolerances than CD, and as a result parameter variations, noise, cross-talk from neighboring tracks, and ISI tend to become more severe. Because of these developments, an increasing interest can be discerned in reception schemes that can handle this mixture of artifacts in a near-optimum fashion [2],[3],[4],[5],[6]. Schemes of this kind are generally built around a Viterbi detector, which is based on a Finite State Machine (FSM) or trellis, that is tailored to the d constraint. The states of the FSM correspond one to one with the allowed sequences of a predetermined length n of channel bits that are compatible with the d-constraint. Attainable operating speed of such detectors is limited by their add-compare-select (ACS) loop, and may not be compatible with the rapidly increasing bit rates of PC-related recording systems, such as CD-ROM and DVD-ROM, and like developments in bit rates for the new emerging video recording formats such as DVR.

It is an object of the present invention to provide a detection apparatus according to the opening paragraph, which allows for a reliable bit detection and which yet has a high operating speed. According to the invention the detection apparatus is characterized in that mutually complementary sequences of n subsequent bits are allocated to the same state. A high operating speed is attained through a substantial detector simplification. This simplification is based on the recognition that the key difficulty at hand is that of pinpointing the location of recorded transitions. The polarity of the signal between transitions, by comparison, is literally visible 'at a glance', and reliable polarity detection comes almost for free.

The detection apparatus according to the invention is very suitable for deriving a bit sequence ($\hat{x}_k$) from an input information signal according to a runlength limited code. In that case, as claimed in claim 2 preferably n is equal to the minimum allowed runlength of said code. By exploiting this fact, the state diagram underlying the detector can be collapsed to contain only a single non-transient state, and the detection process can be reformulated in terms of difference metrics, as claimed in claim 3. All paths share this state. The resulting critical loop involves one addition and a binary selection, while digital word lengths within the loop can be unusually small (e.g. 3 or 4 bits). These features permit a very high operating speed.

The path metric may be calculated on the basis of a partial response of a duration longer than the minimum runlength plus 1 (or, longer than d+2). In that case one or more bits preceding the sequence of bits relevant to a state transition have to be determined by an auxiliary method, e.g. by local sequence feedback as described in claim 4, or by threshold detection described in claim 5 or by runlength pushback detection described in claim 6.

Figure 2:
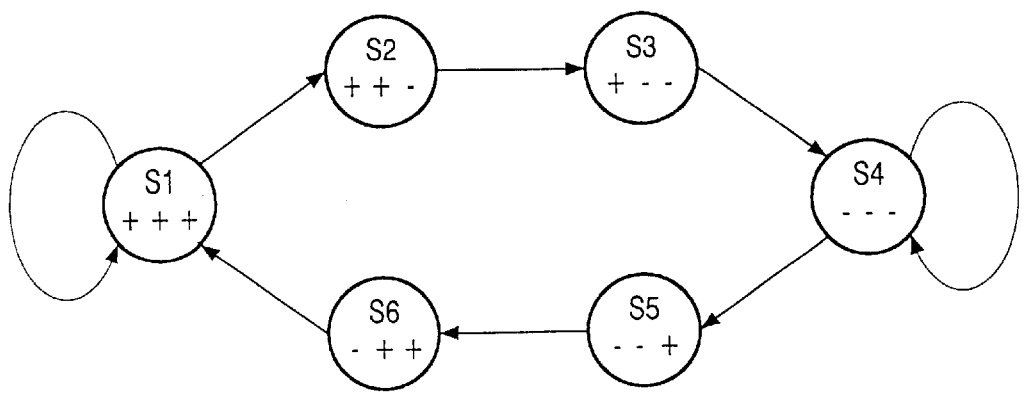
Figure 3:
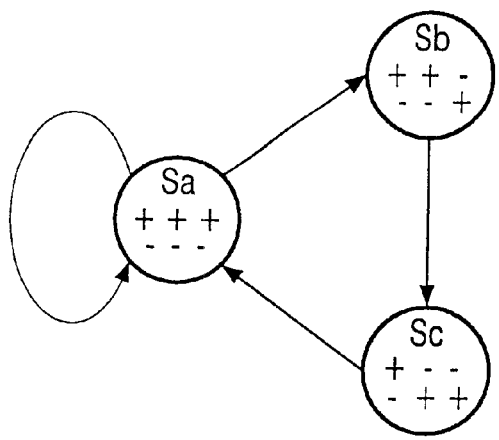
Figure 4:
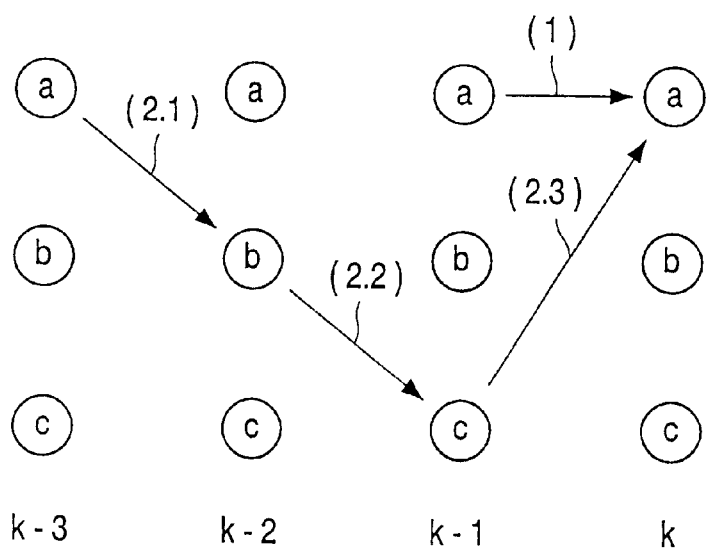
Figure 5:
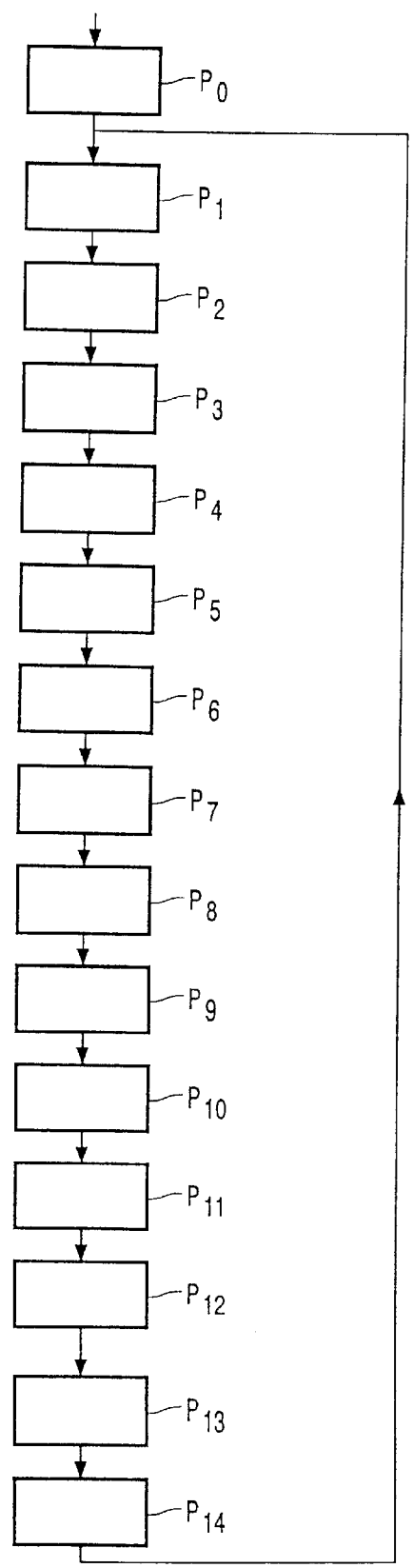
Figure 6:
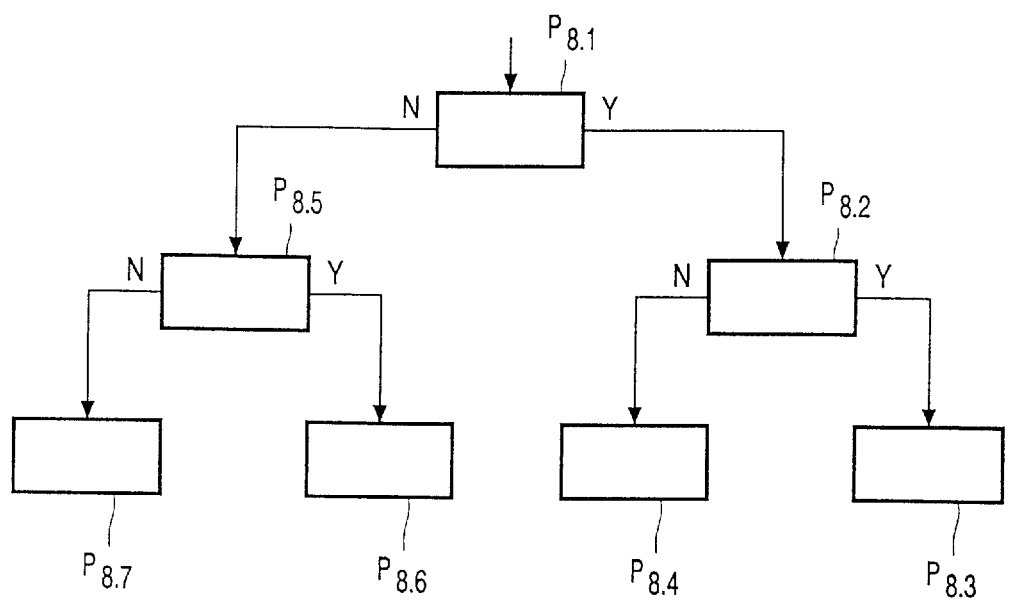
Figure 7:
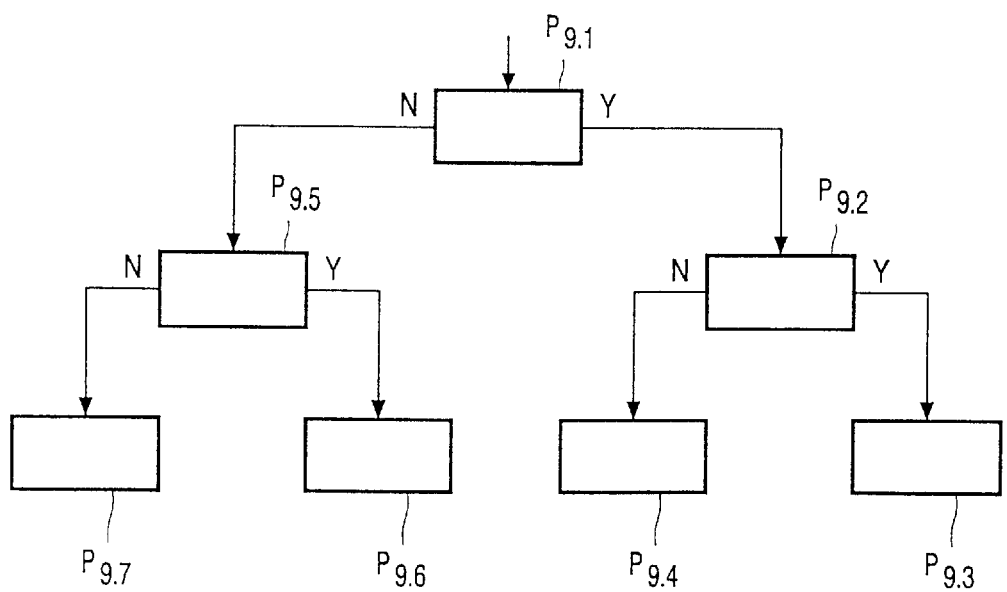
Figure 8:
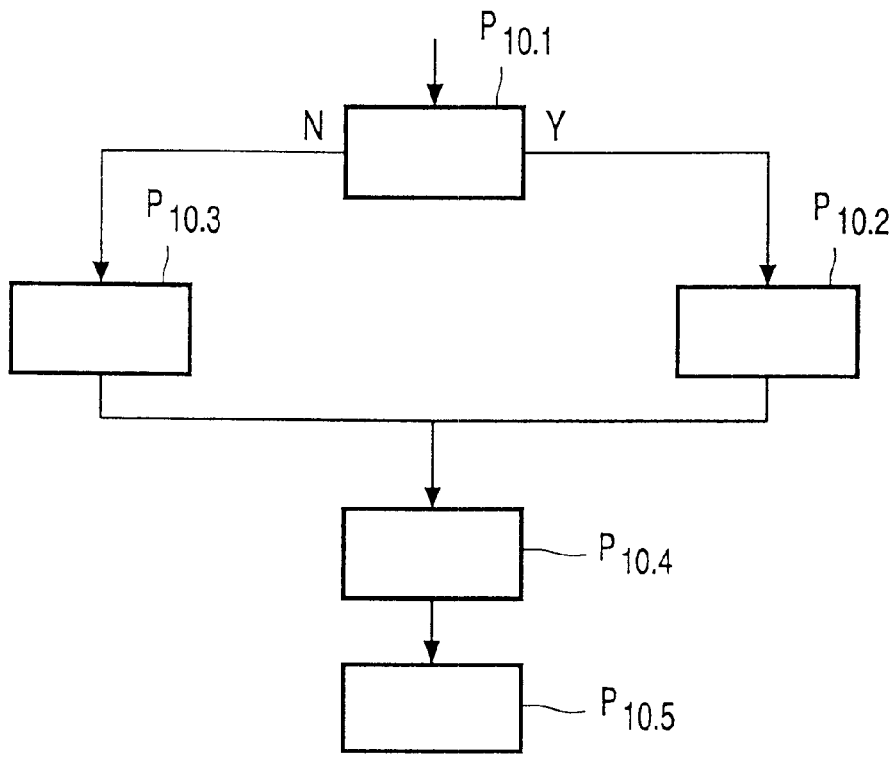
Figure 9:
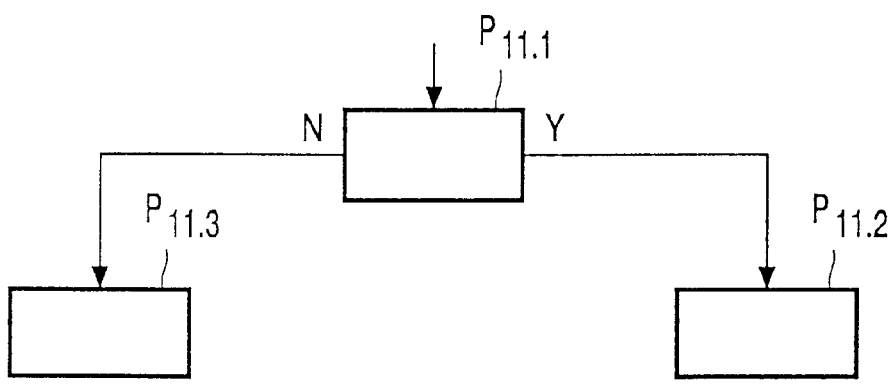
Figure 10:
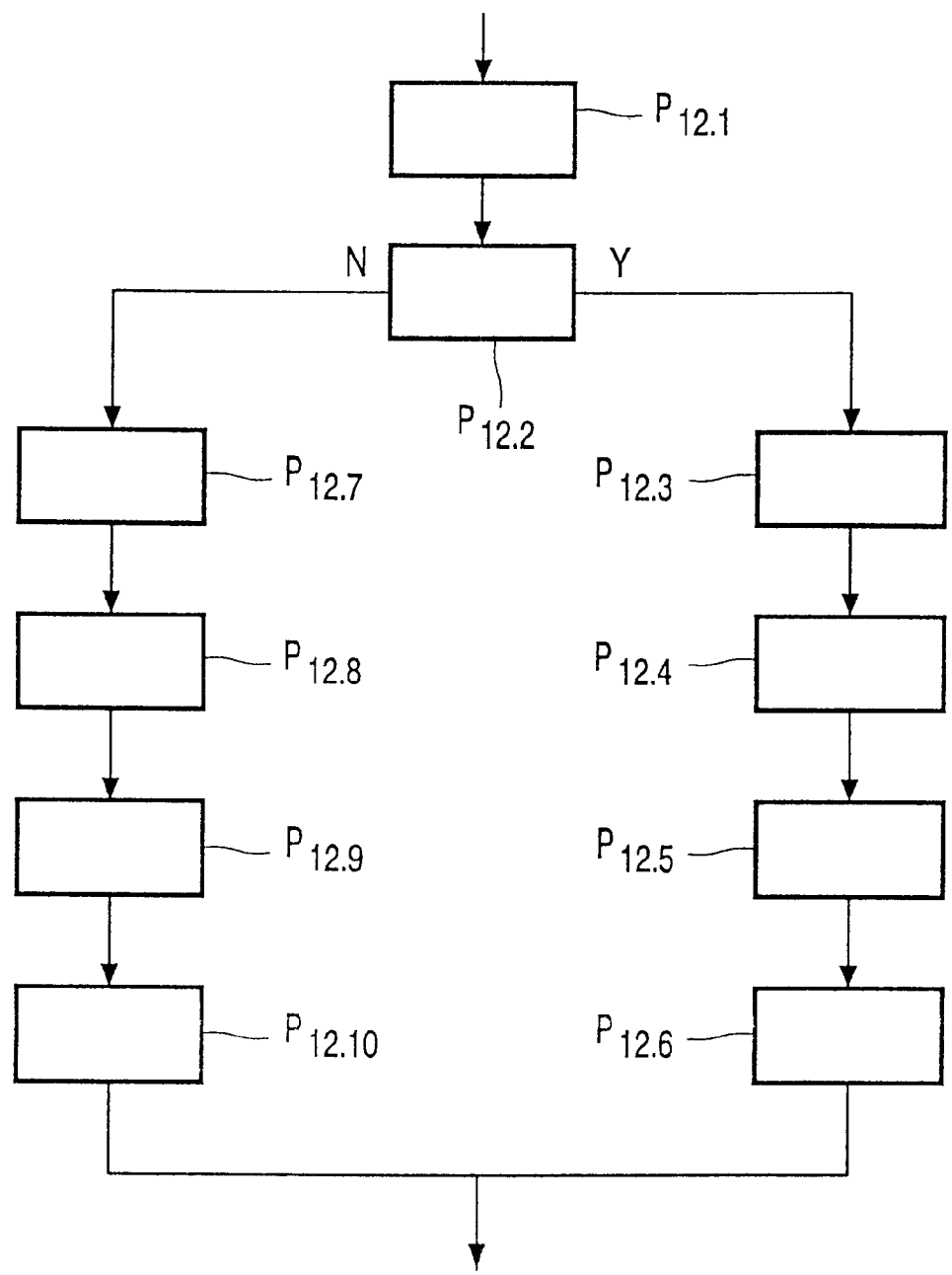
Figure 11:
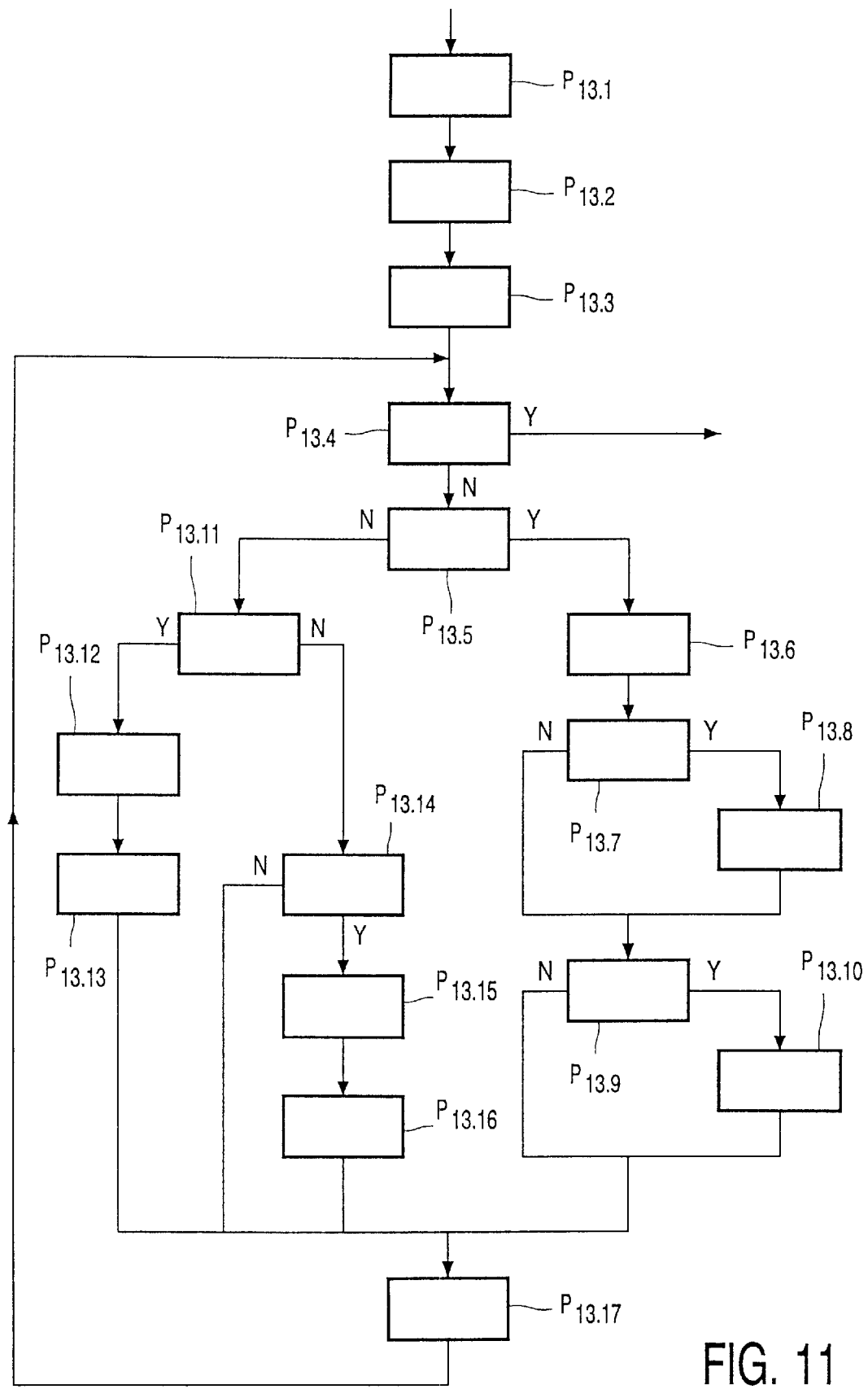
Figure 12:
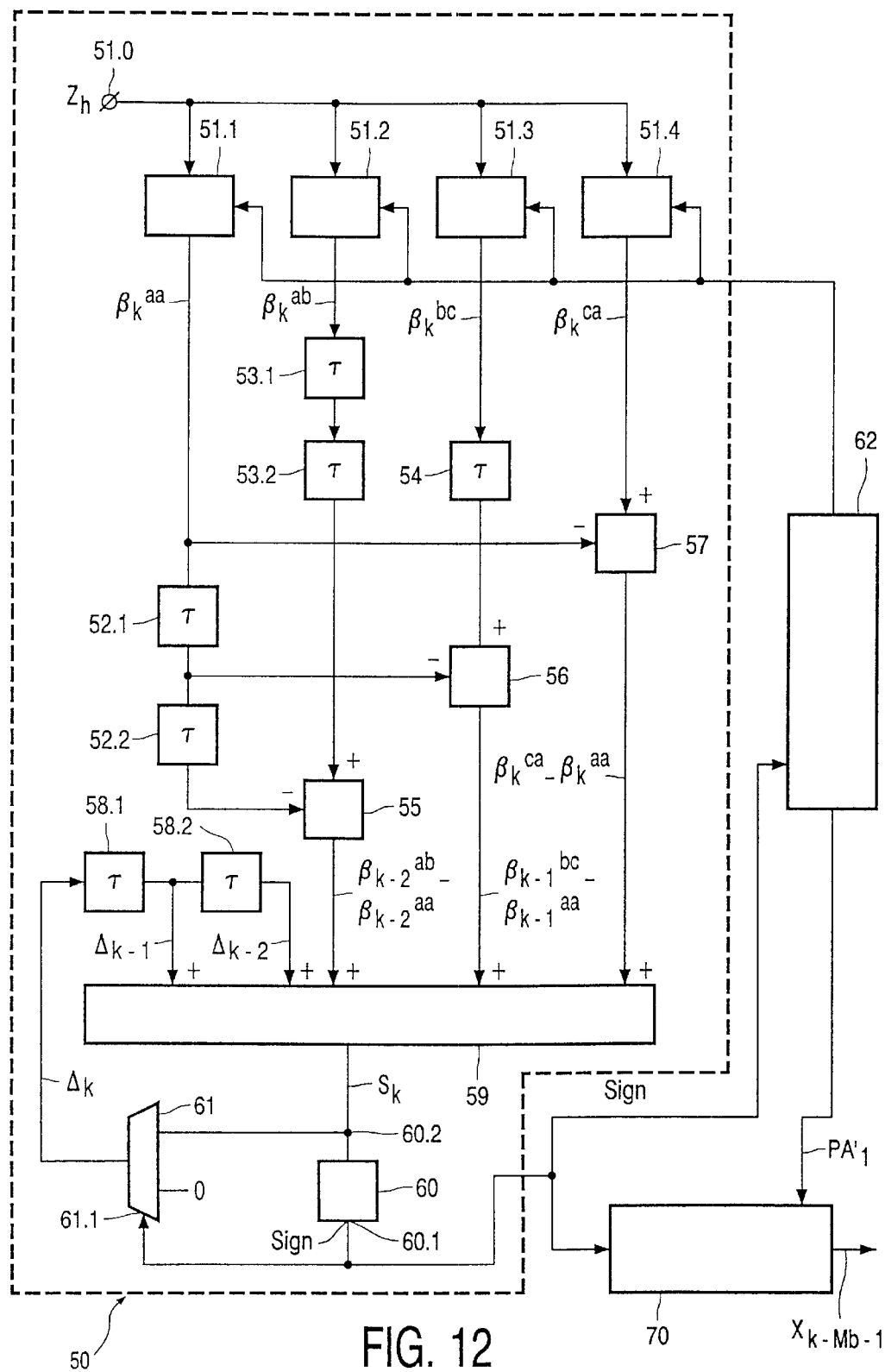
Figure 13:
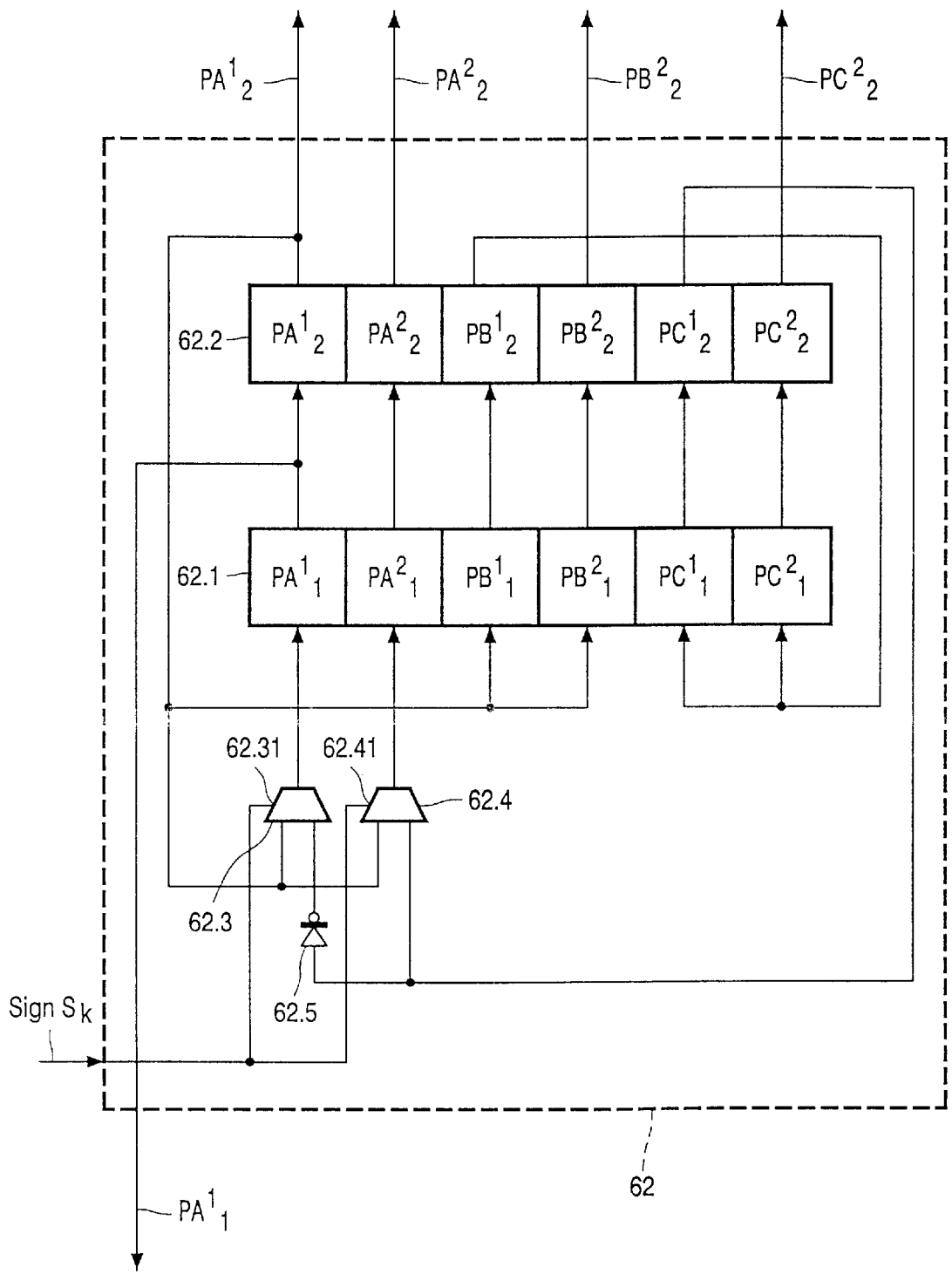
Figure 14:
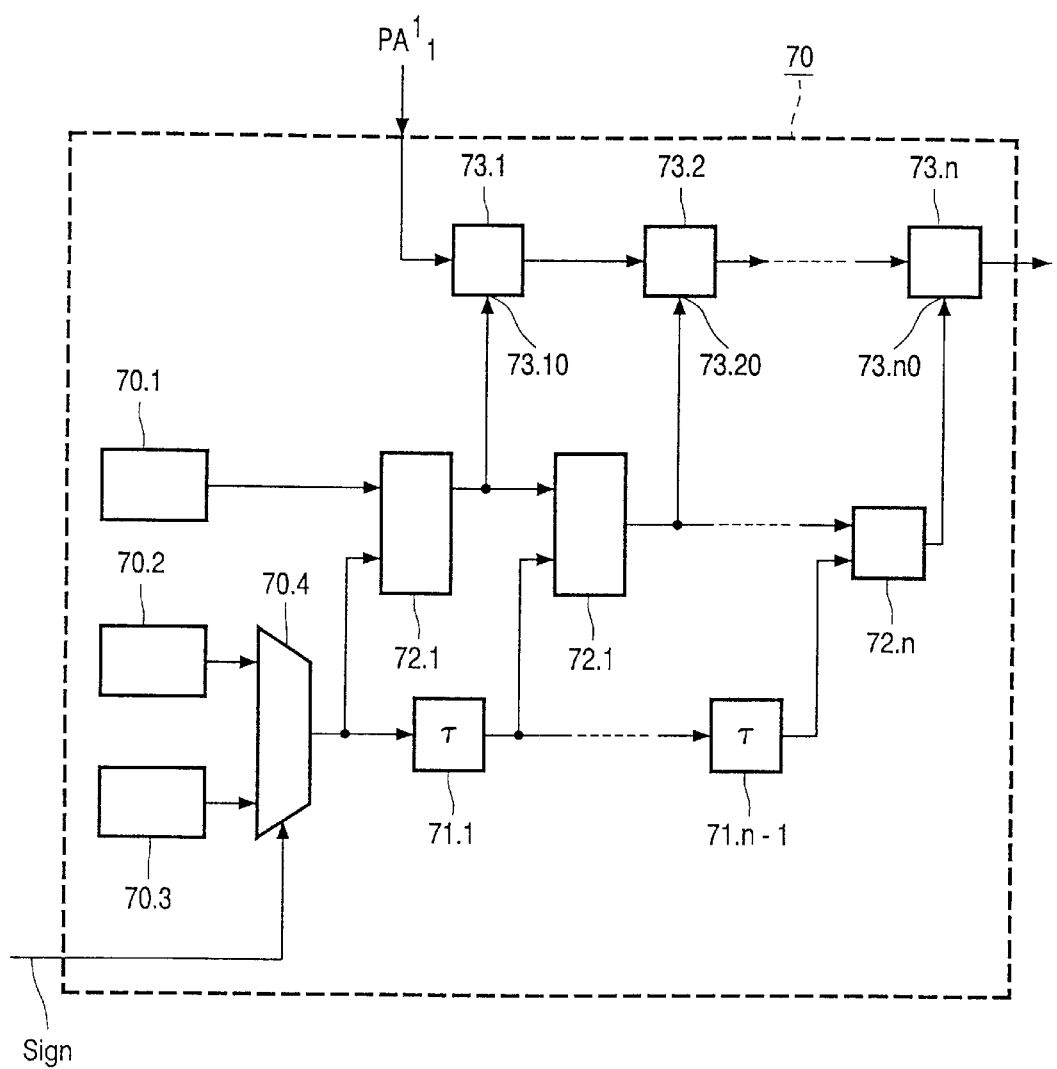
Figure 15A:
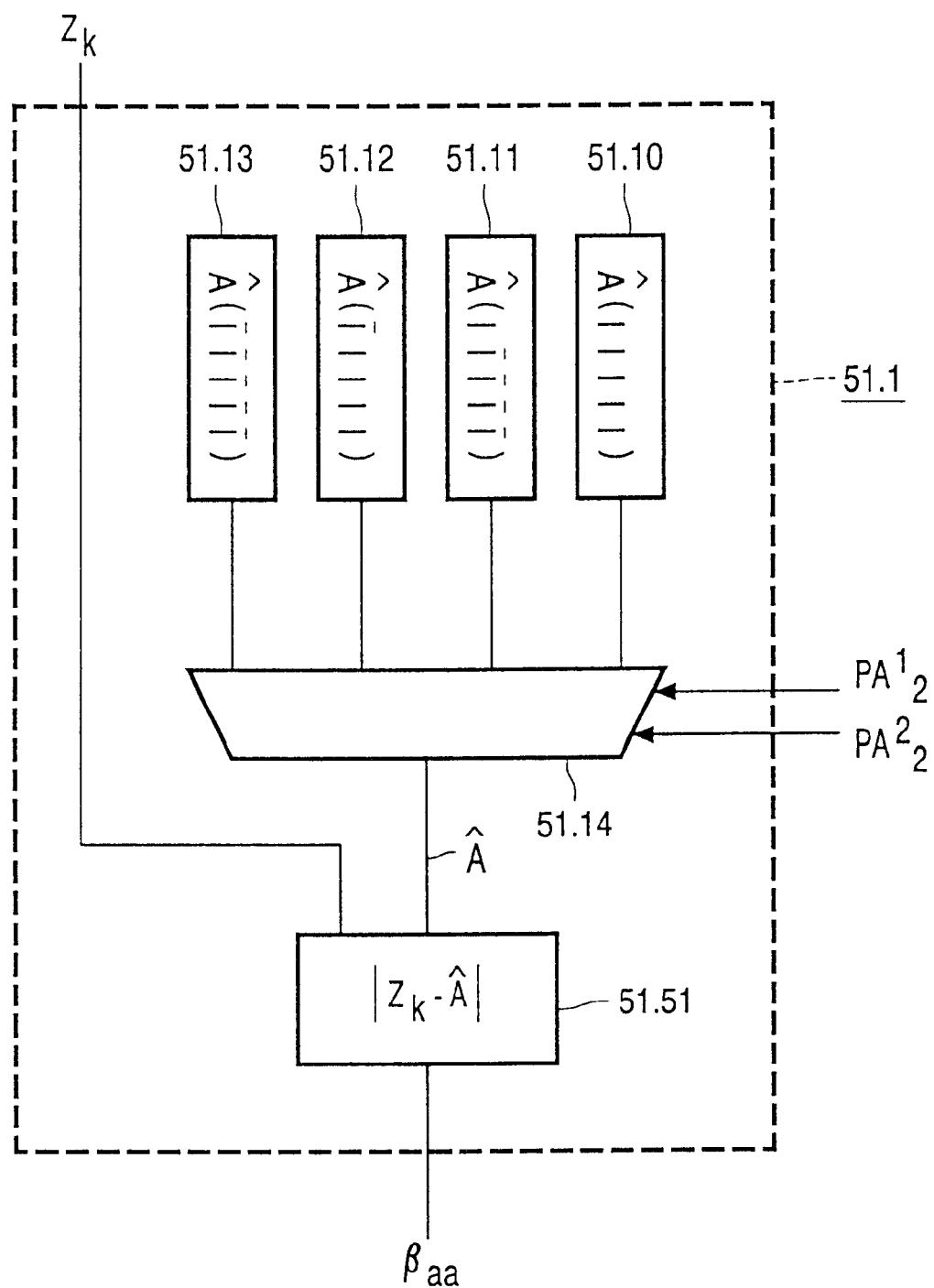
Figure 15B:
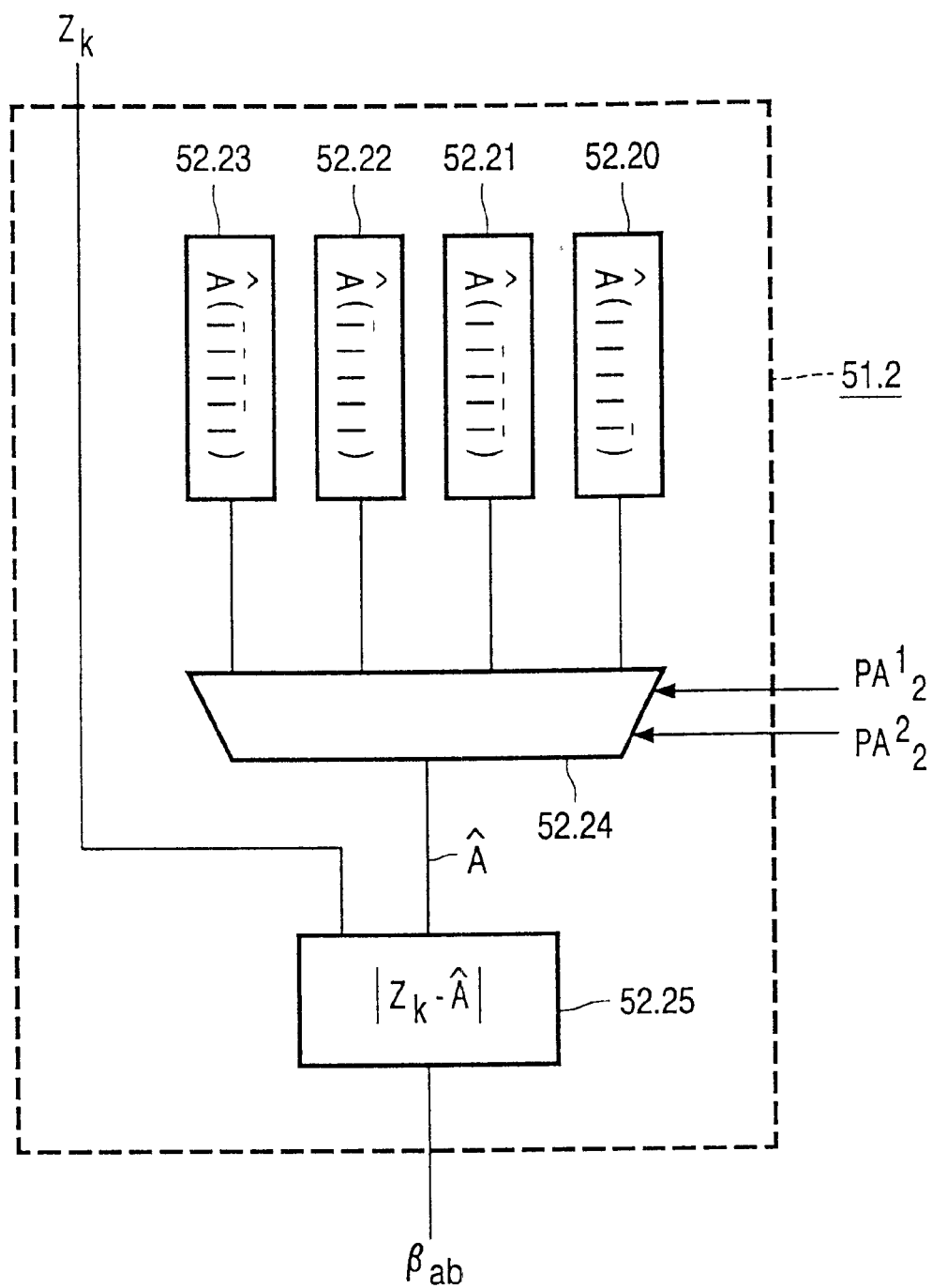
Figure 15C:
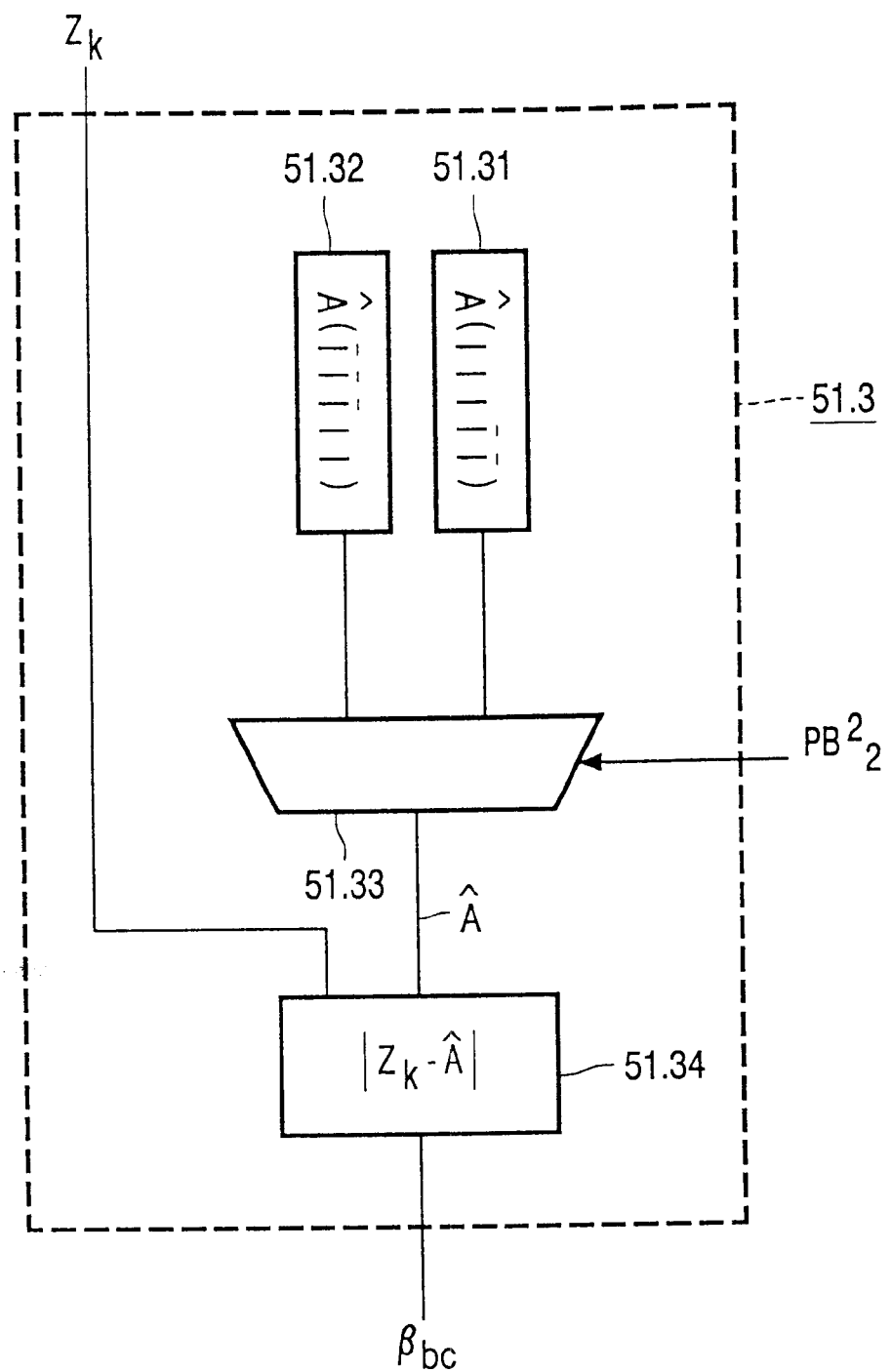
Figure 15D:
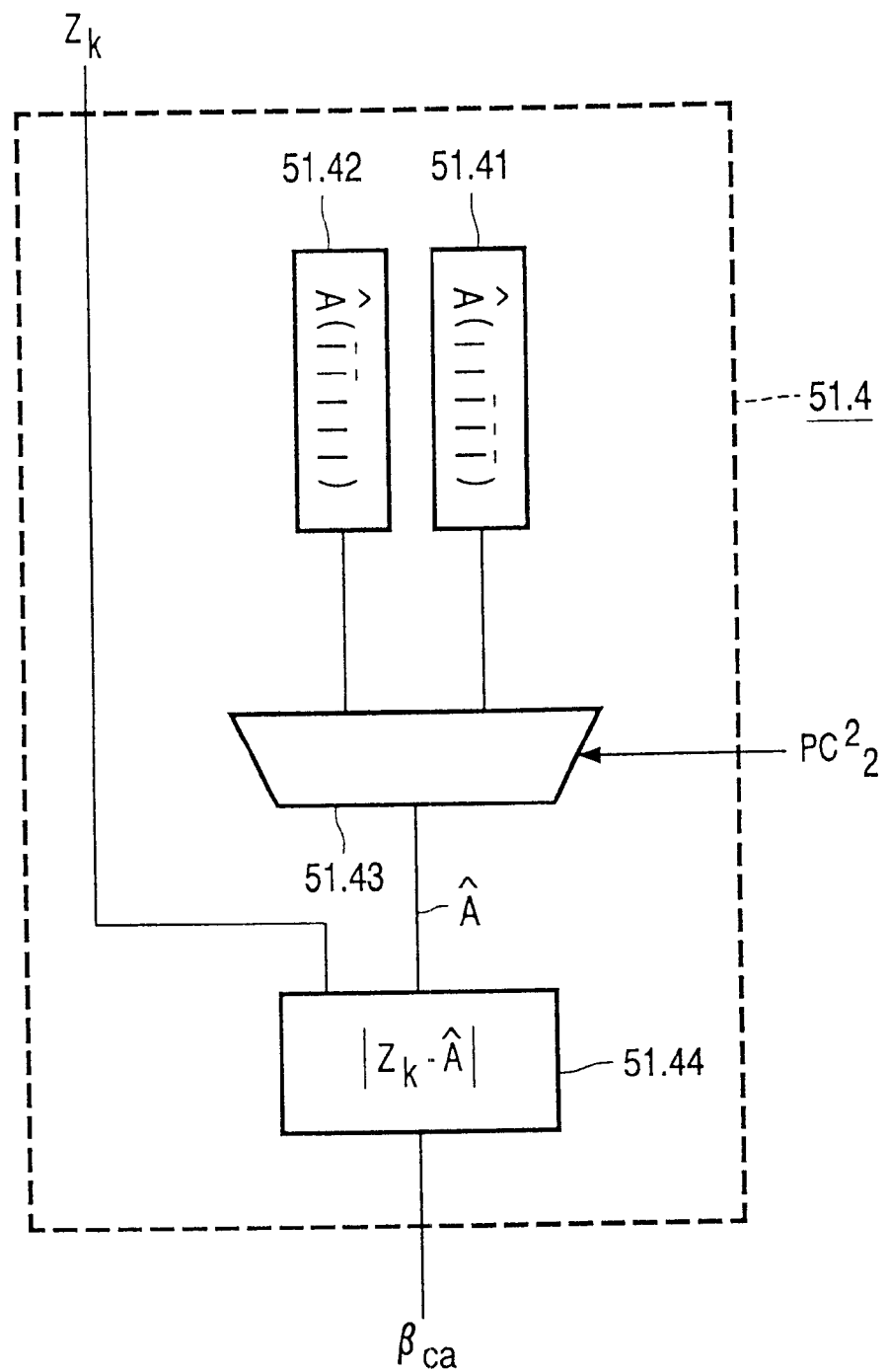
Figure 16:
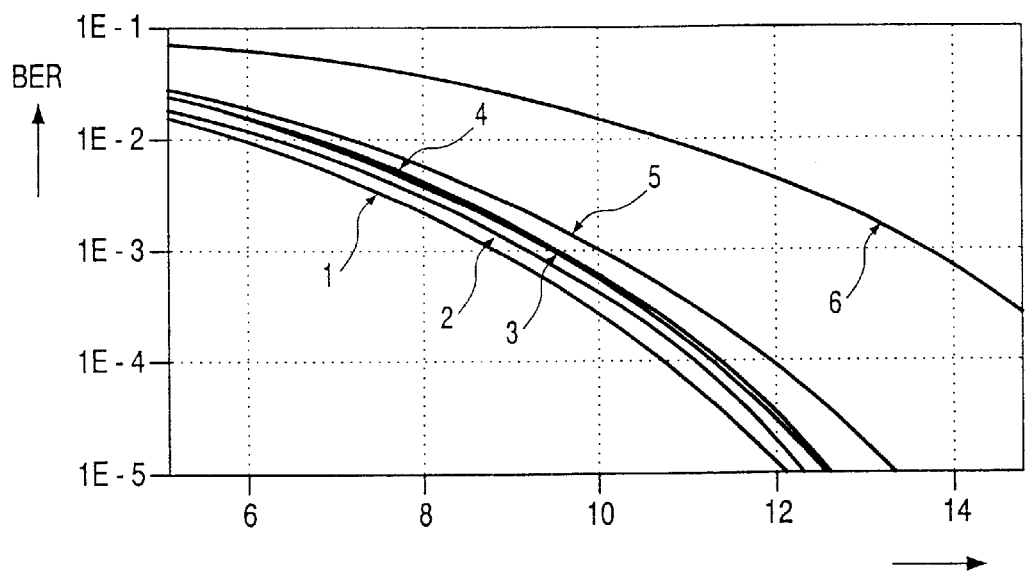
Figure 17:
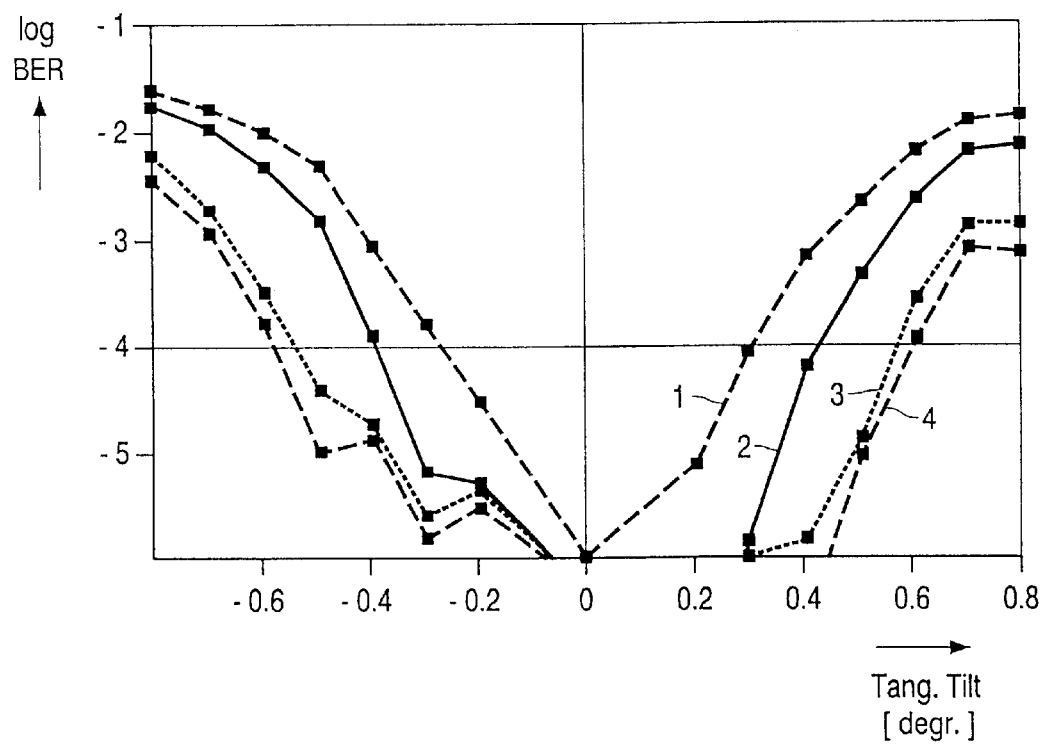

These and other aspects of the invention are discussed in more detail with reference to the drawing. Therein:

FIG. 1 schematically shows a reproduction system for reproducing a record carrier, FIG. 2 shows a state diagram for a conventional detector, in the case wherein the states represent a sequence of length d+1, with d=2, FIG. 3 shows a state diagram for a detector according to the invention, FIG. 4 shows a further diagram for explaining the invention, FIG. 5 shows a representation of the detector according to the invention in the form of a program which is implementable at a general purpose processor, FIG. 6 shows in more detail a first portion of the program of FIG. 5, FIG. 7 shows in more detail a second portion of the program of FIG. 5, FIG. 8 shows in more detail a third portion of the program of FIG. 5, FIG. 9 shows in more detail a fourth portion of the program of FIG. 5, FIG. 10 shows in more detail a fifth portion of the program of FIG. 5, FIG. 11 shows in more detail a sixth portion of the program of FIG. 5, FIG. 12 shows a representation of a detector according to the invention in the form of dedicated hardware, FIG. 13 shows a first part of the detector of FIG. 12 in more detail, FIG. 14 shows a second part of the detector of FIG. 12 in more detail, FIGS. 15A, 15B, 15C and 15D show a third, a fourth, a fifth and a sixth part in more detail, FIG. 16 shows the bit error rate (BER) as a function of the signal to noise ratio (SNR) for several detectors according to the invention and detectors not according to the invention, FIG. 17 shows the bit error rate (BER) as a function of the tangential tilt for a detector according to the invention and some detectors not according to the invention.

FIG. 1 schematically shows a reproduction system 2. Therein, a record carrier 1, here an optical disc is read out by read unit 3. It is assumed that the data written on the optical disc 1 is coded according to a runlength limited channel code, characterized by a d-constraint and a k-constraint, like the 8–14 EFM coding scheme used in the Compact disc standard. However, the present invention is also applicable to the 8–16 EFM+ coding scheme as adopted in the DVD (Digital Video Disc) standard. The EFM code has a minimum runlength d+1 (the distance between subsequent bits having a same value that are separated by a sequence of bits having the inverse value) of 3, and a maximum runlength of 11. The EFM+ code also has a minimum runlength d+1 of 3 and a maximum runlength of 11. In another embodiment the disc is a DVR-ROM disc, which is coded according to the EFMCC coding scheme, also having a minimum runlength d+1 of 3 and a maximum runlength of 11. The EFMCC coding scheme is described in PH-NL 000074. The disc may otherwise be a DVR-RW disc having a coding scheme 17PP with a minimum runlength d+1 of 2 and a maximum runlength of 8. In again another embodiment the disc is of a magnetic, or a magneto-optical type. For the detector described here, only the minimum runlength constraint is important. Although the invention is explained for a practical case wherein d=2, the invention is equally applicable for other values of the d-constraint.

The output of the read unit 3 is filtered by an equalizer 4 e.g. to eliminate undesired intersymbol interference or to optimize timing recovery. The equalizer 4 also comprises sampling means so as to generated a sampled input signal $z_k$. The output signal of the equalizer 4 is used by the detector 5 to obtain the sequence of detected channel symbols. The operation of the detector 5 will be described later in more detail. The detected channel symbols are received by a channel decoder 7 which converts the channel symbols into intermediate symbols (comprising user data and parity symbols). The intermediate symbols are converted by an error corrector 8 which substantially reduces the bit error rate. The output of the error corrector 8 constitutes the output of the reproduction system 2.

The record carrier need not be disc shaped, but may otherwise be in the form of a card.

The detector input $z_k$ is obtained by applying the replay waveform to a prefilter or equalizer 28, whose output is sampled in synchronism with the recorded data $\alpha_k$ under the control of a timing-recovery scheme. If the overall system is stationary and noise $n_k$ is additive then $$z_k = h(\alpha_{k-M}, \ldots \alpha_{k-1}, \alpha_k) + n_k. \tag{1}$$

Here h(.) is a deterministic (and possibly nonlinear) function of the recorded data symbols $\alpha_{k-M}, \ldots \alpha_{k-1}, \alpha_k$. M denotes the memory length of the overall system, and $n_k$ denotes the noise component of $z_k$. M may be in the order of between 10 and 100. But for a reliable estimation of the value $z_k$ a value of M is in the order of 3 to 5 generally is sufficient.

In the example below a conventional detector is described. By way of example the memory length is restricted to M=3. Larger values of M will be considered later. For M=3, $z_k$ depends on the current digit $\alpha_k$ along with a total of 3 past digits $\alpha_{k-3}, \alpha_{k-2}, \alpha_{k-1}$, which together define the state of the system at moment k. The d=2 constraint precludes the bit combinations +−+ and −+−, so that only six states are permissible. The length n of the considered sequences of channel bits equals 3. The constraint further precludes various successions of states.

This is reflected in the state diagram of FIG. 2.

The diagram shown in FIG. 2 has 6 states $s^1, \ldots, s^6$, four of which are transitory ($s^2, s^3, s^5$ and $s^6$)

Branches in the diagram uniquely characterize each permissible succession of 4 bits $\alpha_{k-3}, \ldots, \alpha_k$, a corresponding noiseless detector input $h(\alpha_{k-3}, \ldots, \alpha_k)$, and a branch metric $G(z_k - h(\alpha_{k-3}, \ldots, \alpha_k))$, where G(x) is a predefined even function of x (typically $G(x) = x^2$ or $G(x) = |x|$). Each state has a path metric that tracks the accumulated branch metrics for the 'shortest' path leading up to that state. The shortest path is herein defined as the path having the lowest path metric value. This metric is a non-decreasing function of time, and a metric renormalization scheme is needed to overcome this problem. Attainable speed of the detector is limited by the ACS operation that must be performed each symbol interval for states $s^1$ and $s^4$. The add and compare operations involve significant digital word lengths and this restricts throughput. Metric renormalization gives additional overhead and restricts throughput further. A more detailed description of this detection process may be found in standard textbooks on Viterbi detection such as [7], Chapter 7.

With reference to FIG. 3 a detector of the invention is described, that alleviates the above restrictions. The basic observation underlying the detector according to the invention is that the polarity of the signal between transitions can be detected reliably without the power of a Viterbi detector. Reliable detection of the location of transitions, on the other hand, does necessitate this power. To account for this observation we must distinguish in the state diagram between the relevant lengths of a run that can be in progress (1, 2, 3 and above).

The state diagram of FIG. 3 is simplified in comparison to the state diagram of FIG. 2, in that states of the diagram of FIG. 2 comprising mutually complementary sequences of n subsequent bits are allocated to the same state. This leads to the three state diagram of FIG. 3 (for n=3).

The diagram has 3 states $s^a$, $s^b$ and $s^c$ that demarcate the length of an ongoing run ($\leq 3, 1$, and 2, respectively). Except for polarity, each state uniquely represents a group of 3 bits $\alpha_{k-3}, \alpha_{k-2}, \alpha_{k-1}$. Specifically $s^a$ corresponds to the triplet +++ or −−−, i.e. to states $s^1$ or $s^4$ in FIG. 2, $s^b$ corresponds to ++−($s^2$)or −−+($s^5$), and $s^c$ to +−−($s^3$) or −++($s^6$). It is sufficient to keep track of the path metric for only a single state, i.e. the non-transient state $s^a$.

Denote the path metric associated to state $s^a$ by $\lambda$, and branch metrics for the branch between state $s^i$ and $s^j$ by $\beta^{ij}$. Then path-metric updates are governed by the equation $$\lambda_k = \min(\lambda_{k-1} + \beta_k^{aa}, \lambda_{k-3} + \beta_{k-2}^{ab} + \beta_{k-1}^{bc} + \beta_k^{ca}). \tag{2}$$

The first term corresponds with a continuation of the ongoing run. The second term corresponds with the start of a new run at moment k. The two competing paths aa, and abca that lead towards state $s^a$ are depicted in FIG. 4. Path aa starts from state $s^a$ at the previous bit position k−1, and involves a single branch metric $\beta_k^{aa}$. Path abca starts from state $s^a$ at a preceding bit position k−3 and comprises three segments ab, bc, ca, involving three separate branch metrics $\beta_{k-2}^{ab}, \beta_{k-1}^{bc}$ and $\beta_k^{ca}$.

To compute branch metrics we need to know for each branch the nominal output h of the channel. This output depends on the polarity of the underlying digits $\alpha_{k-3}, \ldots, \alpha_k$, and for this reason we need to keep track for every state of the current polarity of this string, for example in the form of preliminary decisions $\hat{\alpha}_{k-3}^a, \hat{\alpha}_{k-3}^b$ and $\hat{\alpha}_{k-3}^c$ for the digit $\alpha_{k-3}$. This is a form of local sequence feedback, described in more detail in [7, Section 7.7]. Update of these preliminary decisions occurs in accordance with the state diagram, i.e.

$\hat{\alpha}_{k-3+1}{}^{b}=\hat{\alpha}_{k-3}{}^{a}$, $\hat{\alpha}_{k-3+1}{}^{c}=\hat{\alpha}_{k-3}{}^{b}$, and $\hat{\alpha}_{k-3+1}{}^{a}=\hat{\alpha}_{k-3}{}^{a}$ branch aa survives, and $\hat{\alpha}_{k-3+1}{}^{a}=\hat{\alpha}_{k-3}{}^{c}$ if branch ca survives. (3)

Recovery of the most likely path is accomplished via a traceback procedure. Towards this end the succession of states $s^a$, $s^b$ and $s^c$ over time has to be tracked. Traceback starts from the non-transient state (state $s^a$ in the present example) and the corresponding polarity $\hat{a}_{k-3}$. During traceback, polarity is reversed whenever the state $s^a$ is traversed coming from $s^c$, and is unchanged otherwise.

The path metric $\lambda$ is a non-increasing function of time that tends to grow without bound. In lieu of a metric renormalization mechanism, we may use a difference metric. The use of a difference metric inherently limits the digital word length that is required for metric representation. A particularly convenient difference metric is defined by $$\Delta_k = \lambda_k - \lambda_{k-1} - \beta_k{}^{aa}.$$

In terms of this metric, (2) may be re-written as $$\Delta_k = \min(0, \lambda_{k-3} - \lambda_{k-1} - \beta_k{}^{aa} + \beta_{k-2}{}^{ab} + \beta_{k-1}{}^{bc} + \beta_k{}^{ca}). \quad (4)$$

or, equivalently, as $\Delta_k = \min(0, S_k)$, where $$S_k = -\Delta_{k-1} - \Delta_{k-2} + \beta_k{}^{ca} - \beta_k{}^{aa} + \beta_{k-1}{}^{bc} - \beta_{k-1}{}^{aa} + \beta_{k-2}{}^{ab} - \beta_{k-2}{}^{aa}. \quad (5)$$

Nonzero values of $\Delta_k$ are normally associated with transitions. Typically, $\Delta_k$ is zero for several bit intervals in succession, followed by typically one for unambiguous transitions, sometimes two for ambiguous transitions with 1-bit uncertainty, and in rare situations 3 negative values of $\Delta_k$. Clearly $\Delta_k$ is strictly non-positive. This saves one bit in a digital implementation. Metric updates depend on differences of branch metrics at identical instants, and this property also helps to restrict word lengths. As a result, it typically suffices to represent $\Delta_k$ with around 3 to 4 bits as is shown furtheron.

In order to determine the new difference metric we first need to compute $S_k$. The only component of $S_k$ that was necessarily determined in the previous symbol interval is. $-\Delta_{k-1}$. All other components are either older ($-\Delta_{k-2}$) or can be determined ahead of time via pipelining techniques ($\beta_k{}^{ca} - \beta_k{}^{aa} + \beta_{k-1}{}^{bc} - \beta_{k-1}{}^{aa} + \beta_{k-2}{}^{ab} - \beta_{k-2}{}^{aa}$.). Minimum latency in the computation of $S_k$, therefore, amounts to a single addition. Once $S_k$ is determined, it remains to compare $S_k$ with zero.

Towards this end it suffices to observe the sign bit of $S_k$, thus avoiding the explicit multi-bit comparison that would be needed otherwise. The critical loop of the detector, therefore, consists of a straightforward addition plus a binary selection. This is unusually simple for a Viterbi detector, and permits very high operating speeds.

Memory lengths M larger than the memory length associated with the state diagram of the detector, for each state may be accommodated by tracking 'local' decisions $\hat{\alpha}_{k-M}, \ldots, \hat{\alpha}_{k-4}$ for the surviving path associated with that state. This added information permits branch metrics to be computed across the full memory length of the system. Local decisions $\hat{\alpha}_{k-M}, \ldots, \hat{\alpha}_{k-4}$ are updated in accordance with the state diagram, in the same manner as the decisions $\hat{\alpha}_{k-3}$. Data power associated with the digits $\hat{\alpha}_{k-M}, \ldots, \hat{\alpha}_{k-4}$ is not exploited by the detector and should be a small fraction of the overall received data power in order for performance to approach that of a full-fledged Viterbi detector for a system with memory length M (which would necessarily be much more complex).

For optical recording systems of practical interest, this condition is normally met. Nonlinear ISI can be handled by computing branch metrics via look-up tables. Both with and without sequence feedback, it is straightforward to adaptively fill and update these tables based on error signals that can be extracted within the VD. More details on local sequence feedback and adaptive nonlinearity handling may be found, for example, in [7, Chapter 7]. A method to derive the reference amplitude values directly from the levels in the eye-pattern on the basis of preliminary decisions is described in PHN17088 (European patent application 99969527.3).

A detector according to the invention may be implemented in the form of a program at a general purpose microprocessor. Such a program is shown in FIG. 5.

After variables used in the program are initialized in program portion P0, a loop comprising program portions P1–P13 starts. Also an initial value for the polarity of the input signal is determined. The loop P1–P13 is repeated for each sample $z_k$ of the input signal which is obtained in program portion P1. In program step P2 an array S[ ] comprising the last M+1 states $s^i$ which were traced is updated such that S[i]=S[i−1] for i=M to 1. A new value for S[0] is calculated in program step P11.

In program portion P3 delayed values of $\beta_k{}^{aa}$ are calculated as follows:

$\beta_{k-2}{}^{aa} = \beta_{k-1}{}^{aa}$ and $\beta_{k-1}{}^{aa} = \beta_k{}^{aa}$ In program portion P4 delayed values of $\beta_k{}^{aa}$ are calculated as follows:

$\beta_{k-2}{}^{ab} = \beta_{k-1}{}^{ab}$ and $\beta_{k-1}{}^{ab} = \beta_k{}^{ab}$ In program portion P5 a delayed value for $\beta_k{}^{bc}$ is calculated:

$\beta_{k-1}{}^{bc} = \beta_k{}^{bc}$

In program portion P6 delayed values for the difference metric are calculated:

$\Delta_{k-2} = \Delta_{k-1}$ and $\Delta_{k-1} = \Delta_k$

In program portion P7 delayed values for the intermediate variables $PA_1{}^{1,2}$, $PB_1{}^{1,2}$ and $PC_1{}^{1,2}$ are calculated:

$PA_2{}^1 = PA_1{}^1$, and $PA_2{}^2 = PA_1{}^2$ $PB_2{}^1 = PB_1{}^1$, and $PB_2{}^2 = PB_1{}^2$ $PC_2{}^1 = PC_1{}^1$, and $PC_2{}^2 = PC_1{}^2$ A new value for $\beta_k{}^{aa}$, $\beta_k{}^{ab}$, $\beta_k{}^{bc}$ and $\beta_k{}^{ca}$ respectively is calculated in P8–P11. A new value for $\Delta_k$ is calculated in P12. In P13 backtracking is performed in order to determine the output value $\hat{\alpha}_{k-M}$ which corresponds with the most probable path. In P14 this value is delivered at the output of the detector. The program portions P8–P13 will be described in more detail below.

Program portion P8 comprising the calculation of $\beta_k{}^{aa}$ is described in more detail with reference to FIG. 6. As shown therein program portion P8 comprises the program steps P8.1–P8.7.

In P8.1 it is determined whether $PA_2^2=1$.
In P8.2 it is determined whether $PA_2^1=1$.
In P8.3 the distance measure $\beta_k^{aa}$ is calculated on the basis of the value of the sample $z_k$ and the predicted amplitude $\hat{A}(11111)$ for the sequence of bits 1,1,1,1,1. In this case the distance measure is based on the L1-metric, i.e.: $\beta_k^{aa}=|z_k-\hat{A}(11111)|$.
In P8.4 $\beta_k^{aa}$ is calculated according to $\beta_k^{aa}=|z_k-\hat{A}(1\overline{1}111)|$.
In P8.5 it is verified whether $PA_2^1=1$.
In P8.6 $\beta_k^{aa}$ is calculated according to $\beta_k^{aa}=|z_k-\hat{A}(\overline{1}1111)|$.
In P8.7 $\beta_k^{aa}$ is calculated according to $\beta_k^{aa}=|z_k-\hat{A}(\overline{11111})|$.

Program portion P9 comprising the calculation of $\beta_k^{ab}$ is described in more detail with reference to FIG. 7. As shown therein program portion P9 comprises the program steps P9.1–P9.9.
In P9.1 it is determined whether $PA_2^2=1$.
In P9.2 it is determined whether $PA_2^1=1$.
In P9.3 the distance measure $\beta_k^{ab}$ is calculated on the basis of the value of the sample $z_k$ and the predicted amplitude $\hat{A}(1111\overline{1})$ for the sequence of bits $1111\overline{1}$: $\beta_k^{ab}=|z_k-\hat{A}(1111\overline{1})|$.
In P9.4 $\beta_k^{ab}$ is calculated according to $\beta_k^{ab}=|z_k-\hat{A}(1\overline{111}1)|$.
In P9.5 it is verified whether $PA_2^1=1$.
In P9.6 $\beta_k^{ab}$ is calculated according to $\beta_k^{ab}=|z_k-\hat{A}(\overline{1}111\overline{1})|$.
In P9.7 $\beta_k^{ab}$ is calculated according to $\beta_k^{ab}=|z_k-\hat{A}(\overline{11111})|$.
Program step 9.8 updates $PB_1^2$: $PB_1^2=PA_2^1$.
Program step 9.9 updates $PB_1^1$: $PB_1^1=PA_2^1$.

Program portion P10 comprising the calculation of $\beta_k^{bc}$ is described in more detail with reference to FIG. 8. As shown therein program portion P10 comprises the program steps P10.1–P10.5.
In P10.1 it is determined whether $PB_2^2=1$.
In P10.2 $\beta_k^{bc}$ is calculated according to $\beta_k^{bc}=|z_k-\hat{A}(111\overline{11})|$.
In P10.3 $\beta_k^{bc}$ is calculated according to $\beta_k^{bc}=|z_k-\hat{A}(\overline{11111})|$.
Program step 10.4 updates $PC_1^2$: $PC_1^2=PB_2^1$.
Program step 10.5 updates $PC_1^1$: $PC_1^1=PB_2^1$.

Program portion P11 comprising the calculation of $\beta_k^{ca}$ is described in more detail with reference to FIG. 9. As shown therein program portion P11 comprises the program steps P11.1–P11.3.
In P11.1 it is determined whether $PC_2^2=1$.
In P11.2 $\beta_k^{ca}$ is calculated according to $\beta_k^{ca}=|z_k-\hat{A}(11\overline{111})|$.
In P11.3 $\beta_k^{ca}$ is calculated according to $\beta_k^{ca}=|z_k-\hat{A}(\overline{11}111)|$.

Program portion P12 is shown in more detail in FIG. 10. It is shown therein that this program portion comprises the program steps P12.1 to P12.10.
In P12.1 the sum $S_k$ specified in formula 5 is calculated.
In P12.2 it is determined whether this the sum $S_k>0$.
If this is true than program steps P12.3 until P12.6 are executed.
In P12.3 the assignment $\Delta_k=0$ is executed.
P12.4 assigns $PA_1^2=PA_2^1$.
P12.5 assigns $PA_1^1=PA_2^1$.
P12.6 assigns $S[0]=1$. (predecessor state is $s^a$)
If the outcome of P12.2 is false than program steps P12.7 until P12.10 are executed.
P12.7 assigns $\Delta_k=S_k$.
P12.8 assigns $PA_1^2=PC_2^1$.
P12.9 assigns $PA_1^1=-PC_2^1$.
P12.10 assigns. $S[0]=3$. (predecessor state is $s^c$)

Program portion P13, executing the back-tracking procedure, and comprising the program steps P13.1 to P13.17, is shown in more detail in FIG. 11.
In program step P13.1 a local variable is initialized: Ps=1.
In P13.2 the first entry of an array path[ ] representing a sequence of the last MB bits traced is updated according to: path[0]=$PA_1^1$. MB is a predetermined number.

In P13.3 a loop counter i is initialized: i=0.
In P13.4 it is determined whether i<MB−2.
If this is not the case then program portion P13 is finished. However if the inequality of
P13.4 is true, then the program continues with P13.5.
In P13.5 it is determined whether Ps=1.
P13.6 executes the assignment Ps=S[i].
P13.7 determines whether Ps=1.
P13.8 executes the assignment path[i+1]=path[i].
P13.9 determines whether Ps=3.
P13.10 executes the assignment path[i+1]=-path[i].
P13.11 determines whether Ps=2.
P13.12 executes the assignment Ps=1.
P13.13 executes the assignment path[i+1]=path[i].
P13.14 determines whether Ps=3.
P13.15 executes the assignment Ps=2.
P13.16 executes the assignment path[i+1]=path[i].
P13.17 increments the loop counter by one.

The invention may otherwise be implemented in the form of dedicated hardware. An embodiment is shown in FIG. 12. The detector shown therein comprises a first 51.1, a second 51.2, a third 51.3 and a fourth 51.5 branch metric calculator, which respectively calculate the branch metrics $\beta_k^{aa}$, $\beta_k^{ab}$, $\beta_k^{bc}$ and $\beta_k^{ca}$ from the received sample $z_k$ and the state corresponding to the last 5 detected bits. The detector 50 comprises a first 52.1 and a second 52.2 delay element for generating the delayed values $\beta_{k-1}^{aa}$ and $\beta_{k-2}^{aa}$. The detector 50 comprises a third 53.1 and a fourth 53.2 delay element for providing the delayed value $\beta_{-2}^{ab}$ and a fifth delay element 54 for providing the delayed value $\beta_{k-2}^{bc}$. The detector further comprises a first subtractor 55 coupled to the output of the second delay element 52.2 and to the output of the fourth delay element 53.2 to calculate the difference $\beta_{k-2}^{ab}-\beta_{k-2}^{aa}$. The detector comprises second subtractor 56 for calculating the difference $\beta_{k-1}^{bc}-\beta_{k-1}^{aa}$. The detector further comprises a third subtractor 57 for calculating the difference $\beta_k^{bc}-\beta_k^{aa}$. The outputs of the subtractors 55, 56 and 57 are coupled to respective inputs of an adder 59. The adder 59 further has an input for receiving the delayed difference metric $\Delta_{k-2}$ and the delayed difference metric $\Delta_{k-1}$. The output of the adder 59 is the sum $S_k$. A sign detector 60 provides a signal Sign representing the polarity of the sum $S_k$. The multiplexer 61 selects either the sum $S_k$, if the signal Sign indicates a negative polarity or otherwise the value 0 as the output signal signal $\Delta_k$. Hence the sign detector 60 and the multiplexer 61 together form a minimum detector. The output signal $\Delta_k$ is provided to a sixth 58.1 and a seventh 58.2 delay element in order to generate the delayed values $\Delta_{k-2}$ and $\Delta_{k-1}$. The output 60.1 of the sign detector 60 is further coupled to a local sequence feedback unit 62, and a backtrack unit 70 which will be described in more detail below.

The local sequence feedback unit 62 is shown in more detail in FIG. 13. This unit 62 has a first set of registers 62.1 for storing a set of intermediary variables $PA_1^{1,2}$, $PB_1^{1,2}$ and $PC_1^{1,2}$. The first set of registers 62.1 is coupled to a second set of registers 62.2, which stores delayed values $PA_2^{1,2}$, $PB_2^{1,2}$ and $PC_2^{1,2}$ of these intermediary variables. The output of the register for $PA_2^1$ is coupled to the input of the registers for $PB_1^1$ and $PB_1^2$. The output of the register for $PB_2^1$ is coupled to the input of the registers for $PC_1^1$ and $PC_1^2$. The inputs of the registers for $PA_1^1$ and $PA_1^2$ respectively are coupled to a first and a second multiplexer 62.3 and 62.4. The multiplexers 62.3 and 62.4 have a selection input 62.31 and 62.41 which receives the signal Sign as a control signal. The multiplexer 62.3 has a first input coupled to the output of the register for $PA_2^1$ and a second input which is coupled via an inverter 62.5 to the output of the register for $PC_2^1$. The multiplexer 62.4 has a first input coupled to the output of the register for $PA_2^1$ and a second input which is directly coupled to the output of the register for $PC_2^1$. If the signal Sign indicates a positive polarity, the multiplexers 62.3 and 62.4 select the signal at their first inputs as the output signal. If the signal Sign indicates a negative polarity, the multiplexers 62.3 and 62.4 select the signal at their second inputs as the output signal. The local sequence feedback unit has outputs for providing the values of the variables $PA_2^1$, $PA_2^2$, $PB_2^2$ and $PC_2^1$ to the branch metric calculators 51.1, 51.2, 51.3 and 51.4, as well as an output for providing the value of the variable $PA_1^1$ to the back tracking unit 70.

FIG. 14 shows the track back unit 70 in more detail. The track back unit 70 has a chain of delay elements 71.1, ... 71.n−1. The first delay element 71.1 is coupled to a multiplexer 70.4 which receives the signal Sign as the selection signal. The multiplexer 70.4 selects a first value stored in register 70.2 as its output signal if the signal Sign indicates a positive polarity. The first value represents state Sa of the diagram shown in FIG. 3. The multiplexer 70.4 selects a second value stored in register 70.3 as its output signal if the signal Sign indicates a negative polarity. The second value represents state Sc of the said diagram. The track back unit 70 further comprises a chain of combination units 72.1, ... 72.n. The first combination unit 72.1 has a first input coupled to a register 70.1 which stores a value representing state Sa and a second input coupled to the output of the multiplexer 70.4. The subsequent combination units 72.i have a first input coupled to the output of the preceding combination unit 72.i−1 and a second input coupled to the delay unit 71.i−1. The output of the combination units 72.1, ... ,72.n is defined according to the following table:

|             | second input |      |
| ----------- | ------------ | ---- |
| first input | Sa           | Sc   |
| Sa          | Sa           | Sc   |
| Sb          | Sa           | Sa   |
| Sc          | Sb           | Sb   |

The back-tracking unit 70 has a first chain of toggle elements 73.1, 73.2, ..., 73.n. The first toggle element 73.1 has a first input which receives the signal $PA_1^1$ from the local sequence feedback unit 70. The further toggle elements 73.i have a binary input which receives a binary output signal of the preceding toggle elements 73.i−1. The toggle elements 73.i further have a ternary control input which is coupled to the combination elements 72.i. The function of the toggle elements 73.i is described in the following table:

|              | ternary input |    |    |
| ------------ | ------------- | -- | -- |
| binary input | Sa            | Sb | Sc |
| $\bar{1}$    | $\bar{1}$     | $\bar{1}$ | 1 |
| 1            | 1             | 1  | $\bar{1}$ |

FIG. 15A shows the first branch metric calculator 51.1 in more detail. The calculator 51.1 comprises a first register 51.10 in which the expected response $\hat{A}(11111)$ of the input channel is stored for the succession of bits 11111. Likewise the registers 51.11, 51.12.51.13 store the expected responses $\hat{A}(1\bar{1}111)$, $\hat{A}(\bar{1}1111)$ and $\hat{A}(\bar{1}\bar{1}111)$. The calculator 51.1 comprises a multiplexer 51.14 which selects one of these registers 51.10, 51.11, 51.12.51.13 in response to the selection signals $PA_2^1$ and $PA_2^2$ according to the following table:

| $PA_2^2$ | $PA_2^1$ | register | $\hat{A}$ |
| -------- | -------- | -------- | --------- |
| 0        | 0        | 51.13    | $\hat{A}(\bar{1}\,\bar{1}\,\bar{1}\,\bar{1}\,\bar{1})$ |
| 0        | 1        | 51.12    | $\hat{A}(\bar{1}\,1\,1\,1\,1)$ |
| 1        | 0        | 51.11    | $\hat{A}(1\,\bar{1}\,\bar{1}\,\bar{1}\,\bar{1})$ |
| 1        | 1        | 51.10    | $\hat{A}(1\,1\,1\,1\,1)$ |

The output of the multiplexer 51.14 is coupled to a first input of an absolute difference calculator 51.15 (in case of the $L_1$-norm), which receives the signal $z_k$ at a second input. The absolute difference calculator 51.5 calculates the L1-metric $\beta_k^{aa} = |z_k - \hat{A}|$.

FIG. 15B shows a comparable calculator 51.2 for calculating the L1-metric $\beta_k^{ab} = |z_k - \hat{A}|$. This calculator comprises the registers 52.10, 52.11, 52.12 and 52.13 comprising the values $\hat{A}(1111\bar{1})$, $\hat{A}(\bar{1}111\bar{1})$, $\hat{A}(\bar{1}1111)$ and $\hat{A}(\bar{1}\bar{1}111)$. Likewise the multiplexer 52.24 selects one of the registers in response to the selection signals $PA_2$ $_{and}$ $_{PA2}^2$ according to the following table:

| $PA_2^2$ | $PA_2^1$ | register | $\hat{A}$ |
| -------- | -------- | -------- | --------- |
| 0        | 0        | 52.13    | $\hat{A}(\bar{1}\,\bar{1}\,\bar{1}\,\bar{1}\,1)$ |
| 0        | 1        | 52.12    | $\hat{A}(\bar{1}\,1\,1\,1\,\bar{1})$ |
| 1        | 0        | 52.11    | $\hat{A}(1\,\bar{1}\,\bar{1}\,\bar{1}\,1)$ |
| 1        | 1        | 52.10    | $\hat{A}(1\,1\,1\,1\,\bar{1})$ |

FIG. 15C shows in more detail the calculator 51.3 for calculating the L1-metric $\beta_k^{bc} = |z_k - \hat{A}|$. The calculator comprises the registers 51.31 and 51.32 for storing the values $\hat{A}(111\bar{1}\bar{1})$ and $\hat{A}(\bar{1}\bar{1}111)$ respectively the multiplexer 51.33 selects one of these registers in response to the selection signal $PB_2^2$ according to the following table.

| $PB_2^2$ | register | $\hat{A}$ |
| -------- | -------- | --------- |
| 0        | 51.32    | $\hat{A}(\bar{1}\,\bar{1}\,\bar{1}\,1\,1)$ |
| 1        | 51.31    | $\hat{A}(1\,1\,1\,\bar{1}\,\bar{1})$ |

FIG. 15D shows in more detail the calculator 51.4 for calculating the L1-metric $\beta_k^{ca} = |z_k - \hat{A}|$. The calculator comprises the registers 51.41 and 51.42 for storing the values $\hat{A}(11\bar{1}\bar{1}\bar{1})$ and $\hat{A}(\bar{1}\bar{1}111)$ respectively the multiplexer 51.43 selects one of these registers in response to the selection signal $PC_2^2$ according to the following table.

| $PC_2^2$ | register | $\hat{A}$ |
| -------- | -------- | --------- |
| 0        | 51.42    | $\hat{A}(\bar{1}\,\bar{1}\,1\,1\,1)$ |
| 1        | 51.41    | $\hat{A}(1\,1\,\bar{1}\,\bar{1}\,\bar{1})$ |

In order to compare the performance of the detector according to the invention with other detectors, not according to the invention, a linear system is simulated with overall discrete-time system response 0.29,0.5,0.59,0.5,0.29. This is a worst-case response for a system with memory length, as is shown in [8], and as such tends to emphasize the effect of receiver non-optimalities.

Noise $n_k$ is Gaussian and white. The channel signal-to-noise ratio is denoted SNR and is defined in the sense of the matched-filter bound, SNR=$E_b/N_0$ where $E_b$ is the energy of the system response and $N_0$ is the noise variance.

FIG. 16 compares bit-error rates of a full-fledged (6-state) Viterbi detector (curve 1) with that of several embodiments of the detector according to the invention. Curves 2, 3, 4, 5 respectively show a first embodiment of the transition detector with branch metric function $G(x)=x^2$, a second embodiment of the invention with branch metric function $G(x)=|x|$, a third embodiment of the invention with branch metric function $G(x)=|x|$ and a 3-bit difference metric, and a fourth embodiment of the invention with branch metric function $G(x)=|x|$ and a 2-bit difference metric. In addition curve 6 shows the performance of a bit-by-bit detector in the form of a slicer with zero threshold.

The full-fledged Viterbi detector uses the $L_2$-norm for branch-metric computation (i.e. $G(x)=x^2$, which is optimum for Gaussian noise. Using this same norm, the transition detector requires around 0.4 dB higher SNR to achieve bit-error rates in the order of $10^{-5}$. This loss can be attributed to the fact that it fails to exploit the signal energy that is due to the last tap of the system response ($10.^{10} \log[E_b/(E_b-0.29^2)]=0.38$). A further loss of around 0.2 dB accrues if the $L_1$ norm ($G(x)=|x|$) is used instead of the $L_2$ norm. This replacement simplifies hardware in a digital receiver implementation. For the $L_1$ norm, quantization of the difference metric $\Delta_k$ to 3 bits (or 8 levels: 7 uniformly spaced negative levels plus zero) yields virtually the same performance as with unquantized difference metric, while 2-bit quantization yields a loss of around 0.8 dB. Even in the latter case, the transition detector still outperforms the bit-by-bit detector by around 4 dB.

For the sake of completeness it should be mentioned that with the $L_2$ norm, performance of the transition detector becomes more sensitive to quantization of $\Delta_k$. A total of 4 to 5 bits would then be needed to restrict performance losses due to quantization to within 0.1 dB.

Next a detector according to the invention was applied to replay waveforms that were obtained from an experimental DVD-ROM recorder. In order to stress the system, linear density is 9.2% higher than for a standard DVD-ROM system. The replay signal is digitized and resynchronized to the recorded data via an interpolator that is controlled by a digital PLL. Bit-error rates of various detectors that operate on this re-synchronized signal are compared in FIG. 17 as a function of the tangential tilt of the lens with respect to the disc.

In FIG. 17 the curves 1 to 4 respectively show the bit-error rates for a bit-by-bit detector; a runlength-pushback detector [9], a detector according to the invention, with M=4, and $G(x)=|x|$, and a full-fledged Viterbi detector having M=4.

For the bit-by-bit detector, bit-error-rates remain below $10^{-4}$ across a total tilt window of 0.55 degrees. A runlength pushback detector (RPD) as described in [9] and [5] increases this window to 0.8 degrees. The transition detector having M=4 and $G(x)=|x|$ yields a further improvement to 1.1 degrees, virtually at par with the full-fledged Viterbi detector having M=4. Increments of M beyond 4 have negligible impact on the tilt window.

References

1. E. F. Stikvoort and J. A. C. van Rens, 'An All-Digital Bit Detector for Compact Disc Players', IEEE J. Selected Areas Commun., Vol.SAC-10, No.1, pp.191–200, January. 1992.
2. T. Iwanaga, H. Honma, M. Nakano, R. Katayama, Y. Yamanaka, M. Okada, and S. Shimonou, 'Large Capacity Multimedia Video File Using PRML Detection', 1997 Optical Data Storage Topical Meeting, pp. PD1–PD2, Tuscon, Ariz., USA, April 1997.
3. M. Kagawa, J. Nakano, T. Abiko, and S. Igarashi, 'A Study of Asymmetry Compensation for Partial-Response Maximum-Likelihood Detection in Optical Recording Media', Jpn. J. Appl. Phys., Part 1, Vol.37, No.4B, pp.2214–2216, April 1998.
4. H. Hayashi, H. Kobayashi, M. Umezawa, S. Hosaka, and H. Hirano, 'DVD Players Using a Viterbi Decoding Circuit', IEEE Trans. Consum. Electron., Vol.44, No.2, pp. 268–272, May 1998.
5. W. M. J. Coene, G. van den Enden, and H. Spruit, 'Partial-Response and Full-Response Maximum-Likelihood Bit Detection in Phase Change Recording', Proc. ISOM 1998, October 20–22, Tsukuba, Japan.
6. Chang Hun Lee and Yong Soo Cho, 'A PRML Detector for a DVDR System', IEEE Trans. Cons. Electr., Vol. 45, No. 2, pp. 278–285, May 1999.
7. J. W. M. Bergmans, Digital Baseband Transmission and Recording. Boston: Kluwer Academic Publishers, 1996.
8. F. R. Magee, Jr., and J. G. Proakis, 'An Estimate of the Upper Bound on Error Probability for Maximum-Likelihood Sequence Estimation on Channels Having a Finite-Duration Impulse Response', IEEE Trans. Inform. Theory, Vol. IT-19, pp. 699–702, September 1973.
9. T. Nakagawa, H. Ino, and Y. Shimpuku, 'A Simple Detection Method for RLL Codes (Run Detector)', IEEE Trans. Magn., Vol. 33, No. 5, pp. 3262–3264, September 1997.

What is claimed is:

1. A partial response maximum likelihood bit detection apparatus for deriving a bit sequence ($\hat{x}_k$) from an input information signal, comprising an input for receiving the input information signal, sampling means for sampling, at a predetermined sampling frequency, the input information signal at sampling instants $t_i$ so as to obtain sample values ($z_k$) of the input information signal at said sampling instants $t_i$, said sampling frequency having a relationship with a bit frequency, calculating means for (a) calculating at a sampling instant $t_i$ for one or more of a plurality of states $s_j$ (Sa, Sb, Sc) at said sampling instant, an optimum path metric value $PM(s_j,t_i)$ and for determining for said one or more states a best predecessor state at the directly preceding sampling instant $t_{i-1}$, a state at said sampling instant identifying a sequence of n subsequent bits, (b) establishing the best path from the state at the said sampling instant $t_i$ having the lowest optimum path metric value, back in time towards the sampling instant $t_{i-N}$ via best predecessor states, established earlier for earlier sampling instants, to establish an optimum state at said sampling instant $t_{i-N}$, (c) outputting at least one bit ($x_{k-MB-1}$) of said n bits of the sequence of bits corresponding to said established optimum state at said sampling instant $t_{i-N}$, (d) repeating said steps (a) to (c) for a subsequent sampling instant $t_{i+1}$, characterized in that mutually complementary sequences of n subsequent bits are allocated to the same state.

2. A detection apparatus according to claim 1, characterized in that it is arranged for deriving a bit sequence ($\hat{x}_k$) from an input information signal according to a runlength limited code, n being equal to the minimum allowed runlength of said code.

3. A detection apparatus according to claim 2, characterized in that the path metric is a difference metric.

4. A detection apparatus according to claim 2, characterized in that the calculation of the path metric is based on an M-taps partial response, wherein M>n+1 and in that the calculation includes local sequence feedback.

5. A detection apparatus according to claim 2, characterized in that the calculation of the path metric is based on an M-taps partial response, wherein M>n+1 and in that the calculation includes threshold detection.

6. A detection apparatus according to claim 2, characterized in that the calculation of the path metric is based on an M-taps partial response, wherein M>n+1 and in that the calculation includes runlength pushback detection.

7. A detection apparatus according to claim 1, characterized in that it is arranged for detecting a runlength limited signal having a minimum allowed runlength of 2 symbols.

8. A detection apparatus according to claim 1, characterized in that it is arranged for detecting a runlength limited signal having a minimum allowed runlength of 3 symbols.

* * * * *